US00RE45880E

(19) United States
(12) Reissued Patent
Arnet

(10) Patent Number: US RE45,880 E
(45) Date of Reissued Patent: Feb. 2, 2016

(54) METHOD AND SYSTEM FOR MULTIPHASE CURRENT SENSING

(71) Applicant: GE Hybrid Technologies, LLC, Albany, NY (US)

(72) Inventor: Beat J Arnet, Winchester, MA (US)

(21) Appl. No.: 13/774,415

(22) Filed: Feb. 22, 2013

Related U.S. Patent Documents

Reissue of:
(64) Patent No.: 7,893,650
Issued: Feb. 22, 2011
Appl. No.: 12/011,671
Filed: Jan. 29, 2008

(51) Int. Cl.
*H02P 23/00* (2006.01)
*H02P 21/00* (2006.01)
*G01R 29/16* (2006.01)

(52) U.S. Cl.
CPC ..... *H02P 21/0035* (2013.01); *G01R 29/16* (2013.01)

(58) Field of Classification Search
CPC ..... H02P 21/0035; G01R 29/16
USPC ..... 318/432, 434, 599, 811, 609, 610, 632, 318/400.02
See application file for complete search history.

(56) References Cited

U.S. PATENT DOCUMENTS 4,134,055 A * 1/1979 Akamatsu ..... 318/696
5,146,156 A 9/1992 Marcel
5,206,575 A * 4/1993 Nakamura et al. ..... 318/807
5,479,095 A 12/1995 Michalek et al.
5,854,548 A 12/1998 Taga et al.
6,362,586 B1 * 3/2002 Naidu ..... 318/432
6,693,404 B2 * 2/2004 Hiraga et al. ..... 318/729
6,850,426 B2 * 2/2005 Kojori et al. ..... 363/123
6,998,811 B2 2/2006 Myers et al.
7,248,451 B2 7/2007 Bax et al.
7,271,557 B2 9/2007 Ajima et al.
2003/0094917 A1 5/2003 Garrigan et al.
2005/0050965 A1 3/2005 Zaremba et al.
2005/0063205 A1 * 3/2005 Stancu et al. ..... 363/132
2006/0145653 A1 7/2006 Sarlioglu et al.
2007/0007922 A1 * 1/2007 Sarlioglu et al. ..... 318/438

OTHER PUBLICATIONS

Arnet, Beat J.; U.S. Appl. No. 12/011,671, filed Jan. 29, 2008; Title: Method and System for Multiphase Current Sensing.
Office Action dated May 10, 2010; U.S. Appl. No. 12/011,671, filed Jan. 29, 2008; 9 pages.
Notice of Allowance dated Oct. 19, 2010; U.S. Appl. No. 12/011,671, filed Jan. 29, 2008; 7 pages.
PCT International Search Report; Application No. PCT/US2009/000174; Mar. 18, 2009; 2 pages.
PCT Written Opinion of the International Searching Authority; Application No. PCT/US2009/000174; Mar. 18, 2009; 8 pages.
(Continued)

*Primary Examiner* — Minh T Nguyen

(57) ABSTRACT

A multiphase current sensing method wherein the sum of the phase currents is zero including: sensing a.c. and/or d.c. currents in first and second phases; sensing a.c. current in a predetermined a.c. frequency range in a third phase; and combining the current sensed in the first and third phases and the second and third phases and determining a gain correction factor to be applied to the currents sensed in the first and second phases.

26 Claims, 9 Drawing Sheets

(56) References Cited

OTHER PUBLICATIONS

Written Opinion from the International Searching Authority, International Application No. PCT/US2009/000174, dated Mar. 18, 2009, 8 pages unnumbered.

Eric Favre, Wolfram, Teppan, Current Sensing in Electric Drives—A Future and History Based on Multiple Innovations, LEM Group, Electromotion 2005 $6^{th}$ International Symposium on Advanced Electro Mechanical Motion System, Lausanne, Switzerland, Sep. 27-29, 2005.

* cited by examiner

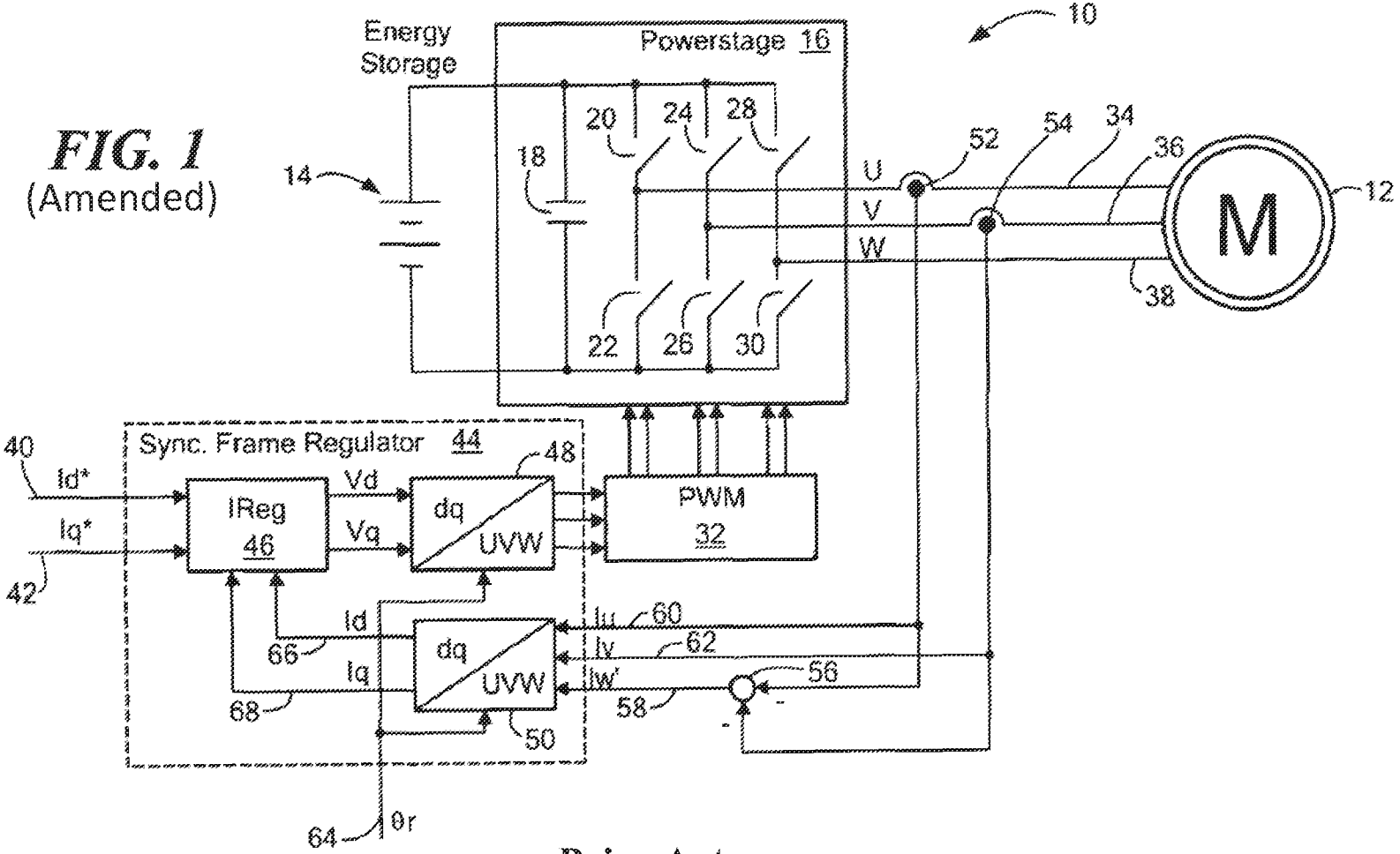
FIG. 1 (Amended)
Prior Art

METHOD AND SYSTEM FOR MULTIPHASE CURRENT SENSING

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*This is a reissue application of U.S. patent application Ser. No. 12/011,671, filed Jan. 29, 2008, now U.S. Pat. No. 7,893,650, issued Feb. 22, 2011.*

FIELD OF THE INVENTION

This invention relates to a method and system for multiphase current sensing and more particularly to a method and system adaptable for e.g. inverters for motor drives, photovoltaic inverters and uninterruptible power supplies.

BACKGROUND OF THE INVENTION

Hybrid vehicles require accurate control of the electric motor in order to achieve maximal fuel savings while ensuring good driveability and safety. The most prevalent control method for advanced traction motors is "field oriented control" (FOC). In FOC, the three-phase current wave-forms and voltage wave-forms (fixed frame) are transformed into a two-axis dq-frame which is rotating at the frequency $\omega s$ of the electrical waveforms (synchronous frame). By this coordinate transformation, a.c. waveforms result in d.c. vectors (also called space vectors). The advantage of this approach is that it is much easier to control d.c. quantities than a.c. quantities. The implementation of a digital current regulator is therefore relatively straightforward and can be very robust and dynamic.

Typically a field-oriented motor drive has a three-phase inverter connected on the d.c. side to an energy storage device (such as a battery) and on the a.c. side to an electric motor. The six switches (e.g. IGBTs or MOSFETs) are controlled by a pulse-width modulation (PWM) module, which, in turn, is commanded according to the output of a synchronous frame current regulator. The inputs to the synchronous frame regulator method include the following:

Iu, Iv: Phase current measurements

Id*, Iq*: Direct and quadrature current setpoints (calculated by the higher level motor control algorithms)

$\theta r$: Rotor flux angle (determined by a rotor flux estimator).

One of the keys to an accurate motor control is accurate current control, which in turn requires accurate measurement of the motor current. The three phase output of a traction drive is typically only instrumented with current sensors on two phases. The reason for this is that the third current can be calculated from the measurement of the other two, based on Kirchoff's law that the sum of current flowing into anode (the motor) must be equal to zero, i.e.

$$Iw=-(Iu+Iv)$$

Several types of sensors can be used for measuring inverter currents. A discussion of the different technologies and advantages/disadvantages can be found in CURRENT SENSING IN ELECTRICAL DRIVES—A FUTURE BASED ON MULTIPLE INNOVATIONS by Eric Favre, Wolfram Teppan, LEM Group, herein incorporated in its entirety by this reference. Because traction drives operate down to very low frequencies including 0 Hz, the current sensors in a traction inverter must be capable of measuring d.c. and a.c. currents. Furthermore, for adequate control response, the sensors need to have a bandwidth of several kHz, typically 50-100 kHz. Hall-effect based current sensors are well suited for measuring current over a wide frequency range. Two types of such sensors exist: "closed-loop" and "open-loop". Both types are based on an arrangement in which the conductor carrying the current to be measured is routed through a gapped core. Located in the airgap is a Hall-effect sensor which measures the flux in the core.

In the open-loop approach, the flux in the core is solely induced by the current carrying conductor and the output of the Hall sensor is used directly as the current measurement. Due to gain tolerances of the Hall sensor, tolerances on core material properties, and variations in the mechanical positioning of the sensor in the airgap, open-loop sensors are not very accurate (typically within 5-10% of rated output).

Closed-loop Hall sensors achieve a significant improvement in accuracy by using a compensation-coil wound on the sensor core and supplied such as to cancel the flux in the core. The Hall sensor acts as a feedback for the flux-canceling loop and is not directly used as a current measurement. Instead, the current in the compensating winding serves as the measurement output and is typically converted into a voltage by means of a resistive shunt. Closed-loop sensors can achieve accuracies that are better than 1%. While closed-loop sensors offer advantages in terms of accuracy, they also have some significant drawbacks. First and most importantly, their power-consumption is proportional to the measured current and can be quite large (several watts). Furthermore, they need to be supplied by a dual supply of +/−12V or higher. In contrast, open-loop sensors can operate from a single supply as low as 5V and consume fractions of one watt of power. This difference is important, because power-supply requirements have a significant impact on the overall cost of the inverter. Closed-loop sensors also tend to be larger and more expensive than open-loop sensors. Those drawbacks are particularly penalizing for larger inverters, with output current exceeding 200-300 amps. Since traction inverters are very cost sensitive, using closed-loop sensors in such applications is often not a viable option, and open-loop sensors are used instead. However, if the gain-error of the sensors is not compensated for, the performance of the drive will suffer. Besides torque linearity problems, gain-errors can also cause torque ripple and drive-train oscillations.

This means that some method of calibrating the open-loop sensors must be used in order to achieve acceptable drive performance. A factory calibration of each individual sensor could be performed during the manufacturing process. However, this operation is expensive and carries the overhead of handling individual calibration constants. Furthermore, this approach can not address gain variations over time or drift with temperature for units in the field.

This problem has been recognized by Ford Motor Company, who proposed a solution in U.S. Pat. No. 6,998,811, entitled, COMPENSATION METHOD FOR CURRENT-SENSOR GAIN ERRORS, Feb. 14, 2006, by Myers et al. herein incorporated in its entirety by this reference, which is based on injecting a high frequency carrier signal electrically into the electric motor and using the high-frequency negative sequence of the measured current to adjust the sensor gains in a closed-loop fashion.

There are apparently several issues with this approach. The injected carrier needs to be at a frequency that is substantially higher than the fundamental frequency of the currents; this increases the bandwidth requirements of the current sensors and therefore their cost, especially for high-speed or high-pole motors. The injected high-frequency carrier can result in emissions that interfere with other circuits or devices in the system. Operation can be affected by saliencies or imbalances in the electric motor; drivetrain oscillations; and noise on the current measurements. It is also computationally intensive, requiring an additional sine/cosine calculation for the negative sequence measurement as well as higher-order filters to extract the carrier signal. The absolute accuracy of the approach depends on the "theoretical unit vector" input, which needs to be model-based and therefore is vulnerable to variations and tolerances of the electric motor. It needs to be tuned and verified for a given electric motor type.

Another approach for dealing with the inaccuracies of open-loop Hall sensors is to pair them with current transformers (CT). For example, U.S. Pat. No. 5,479,095, Dec. 26. 1995 entitled METHOD AND APPARATUS FOR MEASURING AC AND DC CURRENT by Michalek et al. herein incorporated in its entirety by this reference, which consists of using two sensors (one Hall, one CT) on the same conductor to measure the conductor-current. Based on a threshold decision, either the output of the Hall sensor or the output of the current transformer is used as the more accurate current measurement. U.S. Pat. No. 5,146,156, Sep. 18, 1992, entitled CURRENT INTENSITY TRANSFORMER DEVICE FOR MEASURING A VARIABLE ELECTRIC CURRENT by Etter Marcel herein incorporated in its entirety by this reference, proposes an integrated sensor consisting of both a Hall device and a sensing coil (analogous to a current transformer). Both measurement outputs are added together with a frequency dependent weight, resulting in a measurement output at higher current frequencies that is superior in accuracy to the output of the Hall sensor alone. Both these approaches suffer from the following drawbacks. They are not cost-effective in a three-phase system, since two sensing techniques are used on one and the same connector. They do not "learn", i.e. the additional measurement accuracy provided by the CT is only available at higher frequency currents, but is not being used to calibrate the Hall sensor for improved low frequency measurements.

SUMMARY OF THE INVENTION

It is therefore an object of this invention to provide an improved system and method for multiphase current sensing.

It is a further object of this invention to provide such an improved system and method for multiphase current sensing adaptable for inverters.

It is a further object of this invention to provide such an improved system and method for multiphase current sensing in which the sensors use less power.

It is a further object of this invention to provide such an improved system and method for multiphase current sensing which is less expensive, more compact and simpler and easier to source and implement.

It is a further object of this invention to provide such an improved system and method for multiphase circuit sensing which is not computationally complex, integrates well with field oriented control and does not rely on a model of the motor or other load.

It is a further object of this invention to provide such an improved system and method for multiphase circuit sensing which is robust, not sensitive to low frequency transients and does not employ high frequency signals with undesirable EMI emissions.

The invention results from the realization that a truly improved system and method for multiphase circuit sensing particularly suited for inverters, especially those used in motor control can be achieved simply, less expensively and using less power by sensing a.c. and/or d.c. currents in first and second phases over all frequencies; sensing a.c. current in a predetermined a.c. frequency range in a third phase; and combining the current sensed in the first and third phases and the second and third phases and determining a gain correction factor to be applied to the currents sensed in the first and second phases.

The subject invention, however, in other embodiments, need not achieve all these objectives and the claims hereof should not be limited to structures or methods capable of achieving these objectives.

This invention features a multiphase current sensing system having at least three phases wherein the sum of the phase currents is zero including first and second sensors responsive to a.c. and d.c. currents for sensing the current in the first and second phases, respectively; a third current transformer sensor responsive to a.c. current in a predetermined frequency range for sensing the current in the third phase; and an adaptive gain adjustment circuit for combining the current sensed by the first and third sensors and the current sensed by the second and the third sensors to determine a gain correction factor to be applied to the currents sensed by the first and second sensors, respectively.

In a preferred embodiment the adaptive gain adjustment circuit may include a memory device for storing the gain correction factors during periods when the a.c. frequency is without the predetermined range. The adaptive gain adjustment circuit may include a first amplitude detector responsive to the currents sensed by the first and third sensors to provide a first average amplitude and a second amplitude detector responsive to the currents sensed by the second and third sensors to provide a second average amplitude. The adaptive gain adjustment circuit may include an arithmetic circuit responsive to first and second current set points to provide an amplitude reference. The amplitude detector may include a transformer circuit for transforming the sensed currents from the fixed frame to a synchronous frame coordinate system, an arithmetic circuit responsive to the synchronous frame currents to provide an amplitude value, and a filter circuit responsive to the amplitude value to provide the average amplitude. The adaptive gain adjustment circuit may include first and second regulators, responsive to the first and second average amplitudes, respectively, and the amplitude reference for calculating the gain correction factors. Each regulator may include a summing circuit for determining the error value between the amplitude reference and the respective ones of the average amplitudes, a proportional-integral controller, and a switching circuit for selectively applying the error value to the proportional-integral controller within the predetermined range. The proportional-integral controller may retain its integrated error value even when the frequency range is outside the predetermined frequency range. The regulator may include a limiter circuit for limiting the gain correction factor to a predetermined range. Each regulator may include a diagnostic circuit having a comparator responsive to a reference level and a gain correction factor for determining when the gain correction factor exceeds a predetermined value and a timer for providing a failure alarm when the gain correction factor exceeds the predetermined value for a predetermined time. The adaptive gain adjustment circuit may include a multiplier circuit associated with each of the first and second sensors for applying the gain correction factors. The set points may be synchronous frame set points of a field oriented motor control including a power stage for converting d.c. power to multiphase a.c. to drive a motor, a pulse width modulator for operating the power stage and a synchronous frame regulator responsive to the synchronous frame set points and position to provide fixed frame outputs to drive the pulse width modulator.

This invention also features a three phase current sensing system for a motor control wherein the sum of three phase currents is zero and the motor control includes a power stage for converting d.c. power to three phase a.c. to drive a motor, a pulse width modulator for operating the power stage and a synchronous frame regulator responsive to the synchronous frame set points and position to provide fixed frame outputs to drive the pulse width modulator the system including: first and second sensors responsive to a.c. and d.c. currents for sensing the current in the first and second phases, respectively; a third current transformer sensor responsive to a.c. current in a predetermined frequency range for sensing the current in the third phase; and an adaptive gain adjustment current for combining the current sensed by the first and third sensors and the current sensed by the second and the third sensors to determine a gain correction factor to be applied to the currents sensed by the first and second sensors, respectively.

In a preferred embodiment the adaptive gain adjustment circuit may include a memory device for storing the gain correction factors during periods when the a.c. frequency is without the predetermined range. The adaptive gain adjustment circuit may include a first amplitude detector responsive to the currents sensed by the first and third sensors to provide a first average amplitude and a second amplitude detector responsive to the currents sensed by the second and third amplitude sensors to provide a second average amplitude. The adaptive gain adjustment circuit may include an arithmetic circuit responsive to first and second set points to provide an amplitude reference. Each amplitude detector may include a transformer circuit for transforming the sensed currents from the fixed frame to a synchronous frame coordinate system, an arithmetic circuit responsive to the synchronous frame currents to provide an amplitude value, and a filter circuit responsive to the amplitude value to provide the average amplitude. The adaptive gain adjustment circuit may include first and second regulators, responsive to the first and second average amplitudes, respectively, and the amplitude reference for calculating the gain correction factors. Each regulator may include a summing circuit for determining the error value between the amplitude reference and the respective ones of the average amplitudes, a proportional-integral controller, and a switching circuit for selectively applying the error value to the proportional-integral controller within the predetermined range.

This invention also features a multiphase current sensing method wherein the sum of the phase currents is zero including: sensing a.c. and/or d.c. currents in first and second phases; sensing a.c. current in a predetermined a.c. frequency range in a third phase; and combining the current sensed in the first and third phases and the second and third phases and determining a gain correction factor to be applied to the currents sensed in the first and second phases.

In a preferred embodiment the method may further include storing the gain correction factors during periods when the a.c. frequency is without the predetermined range. Combining the current may include determining first and second average amplitudes and an amplitude reference. Combining currents may further include transforming the second currents from a first frame to a synchronous frame coordinate system, converting the synchronous frame currents to an amplitude value and filtering the amplitude value to provide the first and second average amplitudes and from the first and second average amplitudes calculating the gain correction factors for the first and second phases.

This invention also features a multiphase current sensing method for a three phase motor control where the sum of the phase currents is zero including: measuring a.c. and/or d.c. currents in first and second phases; measuring the current in a predetermined a.c. frequency range in a third phase: transforming the first and third phase currents from a fixed frame to a synchronous frame and determining the first phase average current amplitude; transform the second and third phase currents from a fixed frame to a synchronous frame and determining the second phase average current amplitude; calculating a current amplitude reference from the set points of the motor control; combining the first phase average current amplitude and the current amplitude reference to produce a first phase current gain correction factor and the second phase average current amplitude and the current amplitude reference to produce a second phase current gain correction factor; and applying the first and second gain correction factors to first and second phase currents.

In a preferred embodiment method may further include determining whether either gain correction factor is without a predetermined gain correction factor range; monitoring the period during which the gain correction factor is without the predetermined gain correction factor range and setting a failure flag if that period exceeds a predetermined time.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 1 is a schematic block diagram of a prior art motor drive inverter with current sensing;

DETAILED DESCRIPTION OF THE INVENTION

Figure 2:
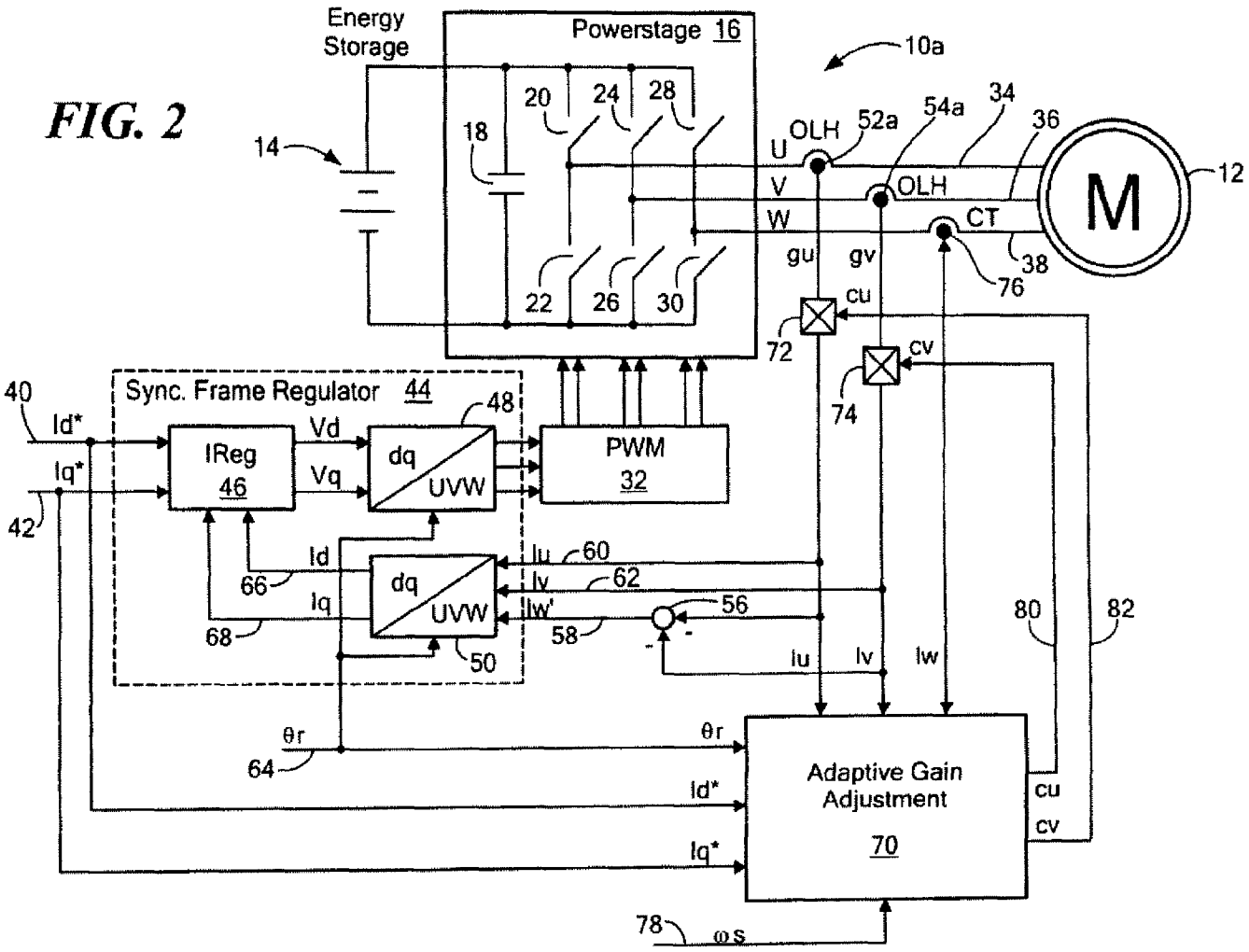
FIG. 2 is a schematic block diagram of a motor drive inverter with current sensing according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a motor control 10 for a three phase motor 12. Motor control 10 uses an energy storage device such as battery 14, to power a switching circuit 16 through a smoothing capacitor 18. Switching circuit 16 may include six switches 20, 22, 24, 26, 28 and 30 which may for example be insulated-gate bipolar transistors, (IGBTs), MOSFETs or any similar suitable devices. Switches 20-30 are opened and closed at times and for periods of times determined under control of pulse width modulator (PWM) 32 to provide multiphase currents, in this case, three phases u, v and w on lines 34, 36, and 38 to motor 12 which is a three phase motor. The motor set points Id*, and Iq* are supplied on lines 40, 42 to synchronous frame regulator 44 which drives pulse width modulator 32. Synchronous frame regulator 44 includes a current regulator circuit 46, a synchronous frame to fixed frame transformer 48 and a fixed frame to synchronous frame transformer 50. Conventionally a pair of sensors such as Hall sensors 52 and 54 are used on lines 34 and 36 to measure the current in phases u and v. These currents are combined using an algebraic summer 56 which combines Iu and Iv in accordance with Kirchoff's law to provide the current in phase w designated Iw' on line 58. The actual currents measured by sensors 52 and 54 are delivered on lines 60 and 62 Iu, Iv.

In operation the two sensed currents Iu, Iv and the third calculated current Iw' are delivered to fixed frame to synchronous frame transformer 50. These values are transformed using the rotor position or rotor flux angle, θr, on line 64 to produce the sync frame currents Id and Iq on lines 66 and 68. These are delivered to current regulator 46 which combines them with the synchronous frame current set points Id*, Iq* on lines 40 and 42 to provide voltage signals Vd and Vq to transformer 48 which converts these synchronous signals to fixed frame signals to drive pulse width modulator 32. The shortcomings of such conventional systems when using inaccurate current sensors is explained supra in the "Background of Invention".

In accordance with this invention the multi-phase current sensing system does not compromise motor control 10a, FIG. 2, but adds an adaptive gain adjustment circuit 70 and two combining circuits such as multipliers 72 and 74 and a third very accurate current transformer sensor 76 which is highly accurate but at a.c. frequency ranges. The predetermined range in which it operates may be defined as R to infinity or it can be $R_1$ to $R_2$ where $R_1$ is for example approximately 40 Hz and $R_2$ is approximately 400 Hz. Sensors 52a and 54a as before may be Hall effect sensors and particularly may be the less expensive but also less accurate open loop Hall effect sensors 52a, 54a. The currents Iu and Iv from the first and second phases u and v are sensed by sensors 52a and 54a and delivered directly to transformer 50 in synchronous frame regulator 44 as previously. Also as previously the algebraic summer 56 uses Iu and Iv to calculate Iw'. However, now adaptive gain adjustment circuit 70 receives all three of the measured outputs Iu from sensor 52a, Iv from sensor 54a, and Iw from current transformer sensor 76. Adaptive gain adjustment circuit 70 also receives the synchronous frame current set points Id*, Iq* from lines 40 and 42 and the rotor position ↓r on line 64. If the electrical frequency ωs as presented on line 78 is within a predetermined range at which current transformer sensor 76 is assured to be accurate, adaptive gain adjustment circuit combines the motor set point synchronous frame currents Id*, Iq* and the actual sense currents Iu, Iv, and Iw to determine correction factors cu, cv on lines 80 and 82 to account for any gain errors in sensors 52a and 54a. These gain correction factors cu, cv on lines 80 and 82 are delivered to multipliers 72 and 74 so that when the gain correction factors cu, cv are combined with the gain errors gu, gv from sensors 52a and 54a a much more accurate current value is produced. Adaptive gain adjustment circuit 70 only calculates the gain error factors cu, cv when the frequency ωs on line 70a is within the predetermined range for current transformer 76. During periods when it is not able to use current transformer sensor 76 to determine the gain errors, the last determined gain errors are continued to be applied. This would occur if the entire system were turned off as well. That is, the last determined gain error factor cu, cv would be stored in a non-volatile memory so that when the system is once again restarted those error correction values would be present and ready to be applied to gain errors gu, gv through multipliers 72 and 74. This allows the system of this invention to accommodate for errors in real time under actual and changing operating conditions in order to avoid the problems attendant on factory or other calibration techniques.

Figure 3:
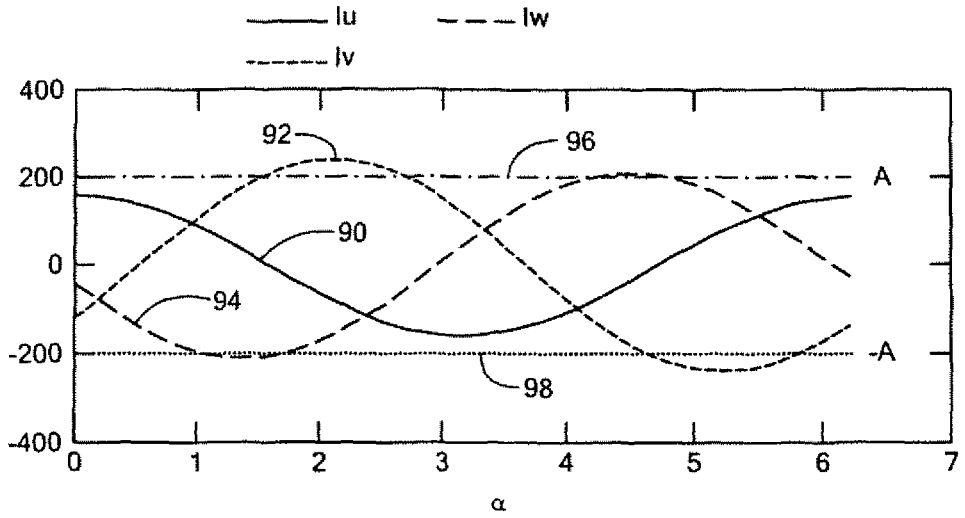
FIG. 3 shows the actual phase currents produced when attempting to control a peak amplitude of 200 amps with sensors having gain errors.
Figure 4:
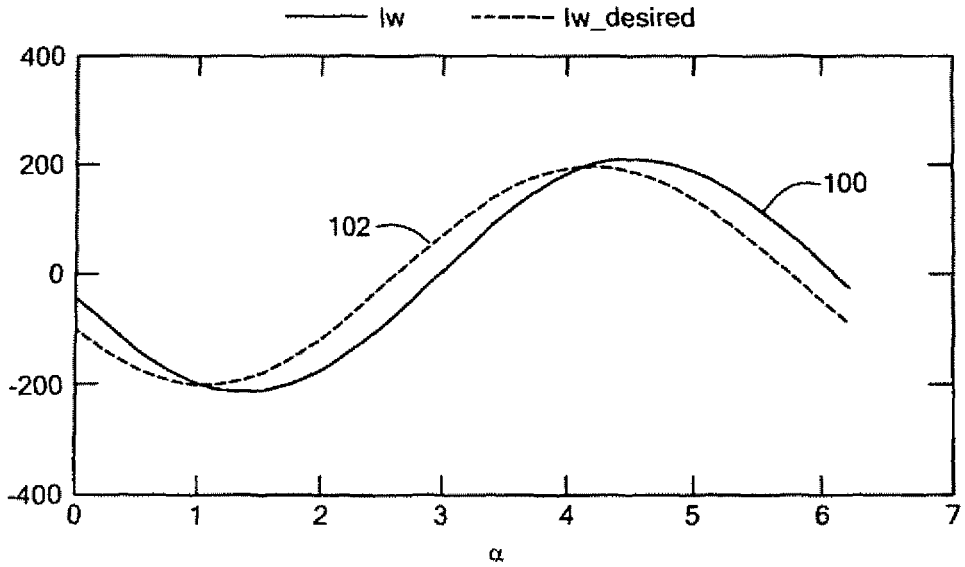
FIG. 4 shows the amplitude and phase errors between the actual and desired current for one phase.
Figure 5:
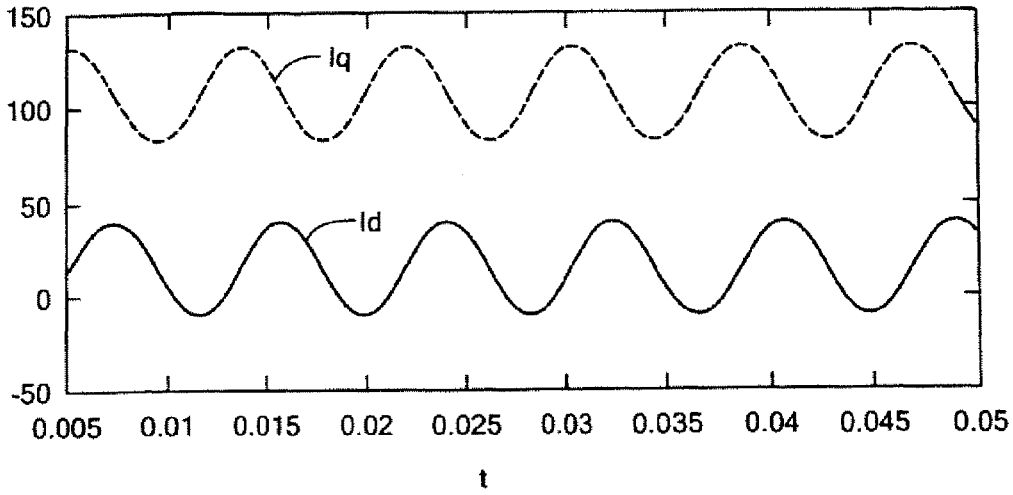
FIG. 5 shows the synchronous frame currents Id, Iq as seen by the motor or other load.
Figure 6:
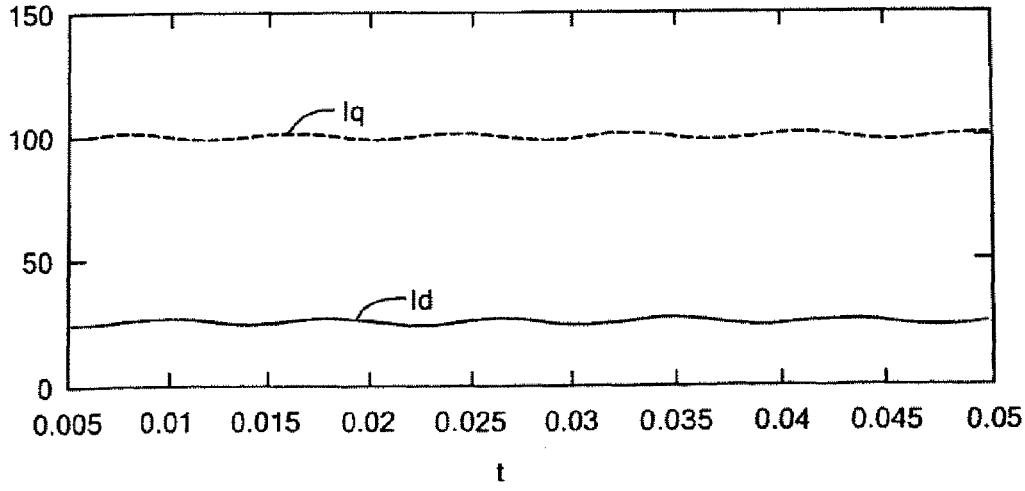
FIG. 6 shows the synchronous frame currents, Id, Iq as perceived by the inverter.

The problem can better be understood with respect to FIG. 3, which shows the actual phase currents that are produced when attempting to control a peak amplitude of, for example, 200 amps with sensor gain errors. For example, if sensor 52a has a gain error of gu=0.8 the current $I_u$ for that phase, phase u would appear as at 90 in FIG. 3. If sensor 54a in FIG. 2 had a gain error of gv=1.2 then the current Iv for phase v would appear as at 92 in FIG. 3. The current in phase w is shown at 94; these are the actual phase currents produced when attempting to control motor 12 where the sensors 52a, 54a have gain errors of 0.8 and 1.2. The actual 200 amp levels +96 and −98 are also shown in FIG. 3. The errors on phases u and v not only produce amplitude errors on those phases as shown in FIG. 3, but they also produce an amplitude error and a phase shift error on phase w as shown in FIG. 4, where the amplitude and phase difference between the actual current 100 and the desired current 102 are shown. The real d-q currents as they are being seen by the plant or the load, e.g. motor 12, FIG. 5, show a large oscillation on both quantities, Iq and Id, which correspond to negative sequence currents. Those currents reduce the efficiency of the drive, influence torque accuracy and can cause drive train oscillations. While the motor actually sees the oscillation shown in FIG. 5, the inverter perceives the Id and Iq currents as depicted in, FIG. 6, with very little oscillation.

Figure 7:
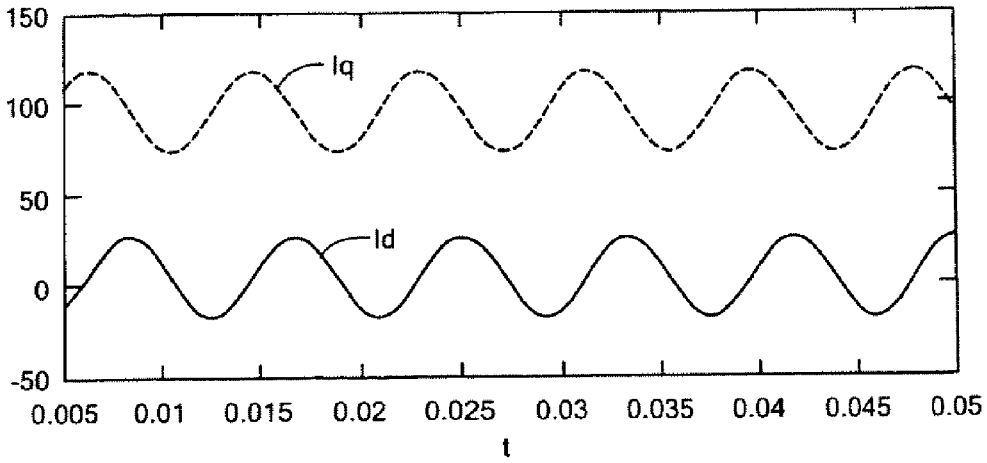
FIG. 7 shows the synchronous frame currents, Id, Iq as perceived by the inverter using current sensing according to this invention.
Figure 8:
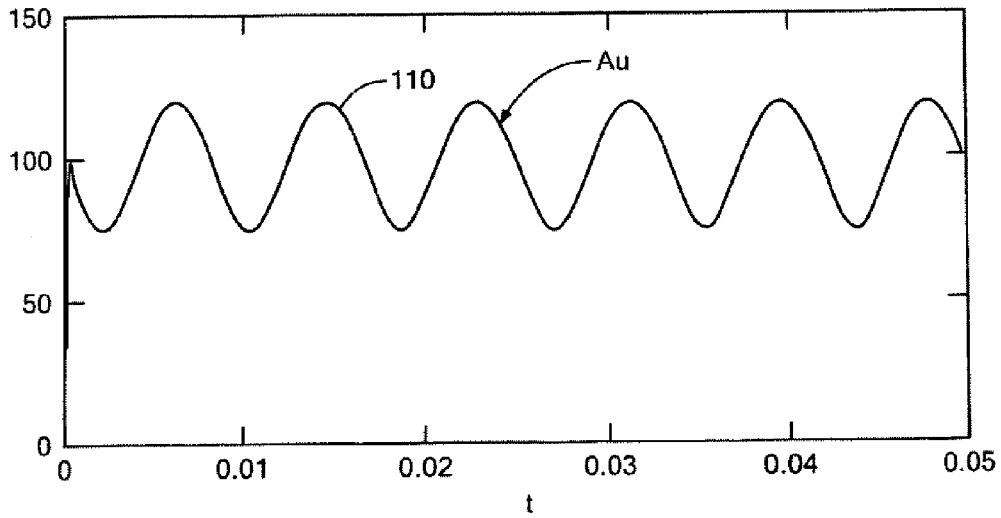
FIG. 8 shows the peak amplitude of the measured current according to FIG. 7.

If now the current sensing system of this invention is employed using current transformer sensor 76, FIG. 2, on phase w, line 38 the inverters perception of the actual currents can be improved. This is so because while the control is still based on the sensor 52a, 54a, feedback on phases u and v another set of Id/Iq is calculated using the current transformer on phase w. In other words instead of calculating Iw from Iu and Iv, that is Iw=−Iu−Iv. Iv is being calculated using measured currents in phase u and w. That is, Iv=−Iu−Iw and Iu is being calculated using measured currents in phase v and w: Iu=−Iv−Iw. The result is as shown in FIG. 7, where the inverter now sees the true oscillating nature of Id and Iq as suggested in FIG. 5. The calculation of the amplitude vector for u and v is the same. As an example, the amplitude or vector length for u is calculated using the current measured by the u and w sensors, namely Hall sensor 54a, and current transformer sensor 76. That is, the average amplitude for current u, Au, is equal to the square root from the sum of squares of Id measured plus Iq measured and this average amplitude Au is shown in FIG. 8, at 110.

In a preferred embodiment the invention uses the difference between the mean of the measured current amplitude Au using sensors 52a and 76 in phases u and w and the commanded current amplitude A* as the feedback quantity to adjust the measurement gain of sensor u. Similarly if the Id and Iq currents are measured using sensors 54a and 76 in phases v and w the difference between the measured current amplitude Av and the commanded current amplitude A* is used to adjust the gain of sensor v. Adaptive gain adjustment circuit 70a, FIG. 9, includes a first amplitude detector 112, which is responsive to Iu and Iw to calculate the average amplitude for phase u and a second amplitude detector 114 which uses Iv and Iw to calculate the average amplitude for phase v. There is also a third channel 116 which includes an arithmetic circuit 118 which combines set points Id* Iq* by calculating the square root of the sum of the squares to produce the amplitude reference A*. Each of amplitude detectors 112 and 114 includes an algebraic summer 120, 122, a fixed frame to synchronous frame transformer 124, 126, an arithmetic circuit 128, 130, for calculating the square root of the sum of the squares and filters 132 and 134 all respectively. In operation, detector 112 receives current Iu directly at transformer 124. Iu is combined with Iw in algebraic summer 120 to provide Iv' to transformer 124 and Iw is provided directly to transformer 124 which then provides the synchronous frame output to arithmetic circuit 128 that provides an amplitude value to filter 132 which filters it to provide the average amplitude for phase u at 136. In a similar fashion Iw and Iv are processed by algebraic summer 122 to provide Iu', Iv and Iw to transformer 126 which then provides the synchronous frame output to arithmetic circuit 130 which in turn provides the amplitude to filter 134 resulting in the average amplitude for phase v at 138. Adaptive gain adjustment circuit 70a, FIG. 10, also includes a closed loop gain adjustment circuit 140. Algebraic summing circuit 142 responds to average amplitude Au and amplitude reference A* to provide and error signal which will be supplied to a proportional-integral controller 144 if switch 145 is closed to contact 148 which occurs when the electrical frequency ωs is within a predetermined range in which current transformer 76 is considered sufficiently accurate and reliable. Similarly algebraic summer 150 responds to average amplitude Av and the reference amplitude A* to provide an output to proportional-integral controller 152 when switch 154 is closed on contract 156, which occurs when ωs is within the predetermined range in which current transformer 76 is considered sufficiently accurate and reliable. Proportional-integral controller 144 and 152 not only act as regulators, but also act as a memory, a non-volatile memory, which acts to preserve the integrated error signal received through switches 146 and 154 when the system is off or when the frequency is outside of the range in which current transformer sensor 76 is deemed reliable. The error signals from switches 146 and 154 to proportional-integral controllers 144 and 152 ultimately become the gain correction factors cu, cv on lines 158 and 160. A diagnostic circuit 161 including output limiters 162, 164 may be used to keep the output of the regulators within reasonable bounds, for example, within plus or minus ten per cent. If they are outside of that range, this can be taken as an indication of a failure and a failure flag may be set. In addition an anti-wind-up path is shown for each proportional-integral controller 144, 152 including an algebraic summer 166, 168 which feeds back the difference between the input and the output of the limiter 162, 164 in each case to the proportional integral controller 144 and 152. Switches 146 and 154 illustrate how the regulator is disabled at frequencies of the phase currents which are too low for the current transformer sensor 76 to produce accurate measurements. However, this is not a necessary limitation of the invention, there might be an upper frequency limit in certain applications beyond which the tuning algorithm is disabled.

Figure 11:
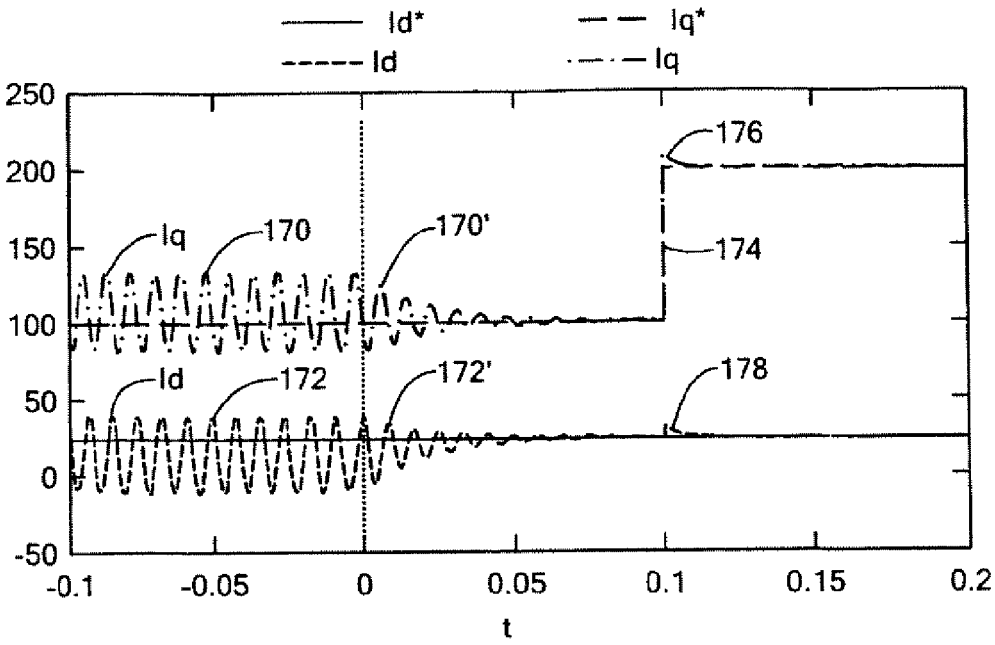
FIG. 11 shows the effect of this invention on mismatch and oscillation in the currents.
Figure 12:
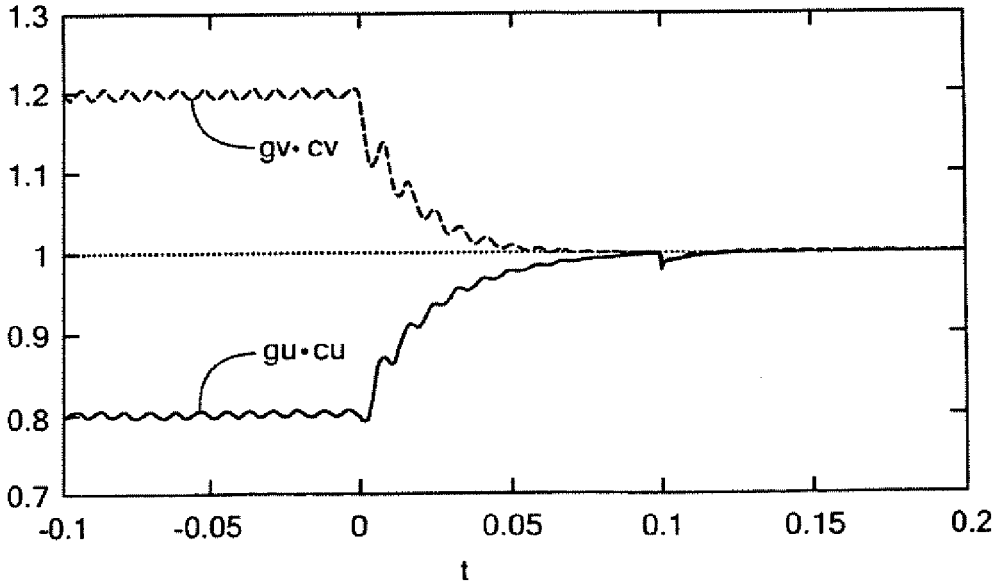
FIG. 12 shows the convergence of the gain error effected by this invention.

The performance of the invention is demonstrated in FIG. 11, again for sensors in the u and v phase, 52a and 54a, having a gain error of 20%, one measuring too low, gu=0.8, the other measuring too high gv=1.2. Iq and Id here show the oscillations as previously explained at 170 and 172 but following time zero when the invention is enabled the oscillations are quickly damped 170', 172'. The illustration in FIG. 11 also shows how robust the invention is with respect to current steps, for at current step 174 of Iq from 100 to 200 amps only a small departure 176 is noted before the system once again settles. Similarly the momentary departure at 178 of Id shows that it quickly settles as soon as the corrective gains cu and cv are applied. A calibration is achieved when gu*=1 and gv* cv=1. This is shown more clearly in, FIG. 12, where the convergence of gv*cv from 1.2 to 1 and gu*cu from 0.8 to 1 is shown.

Figure 9:
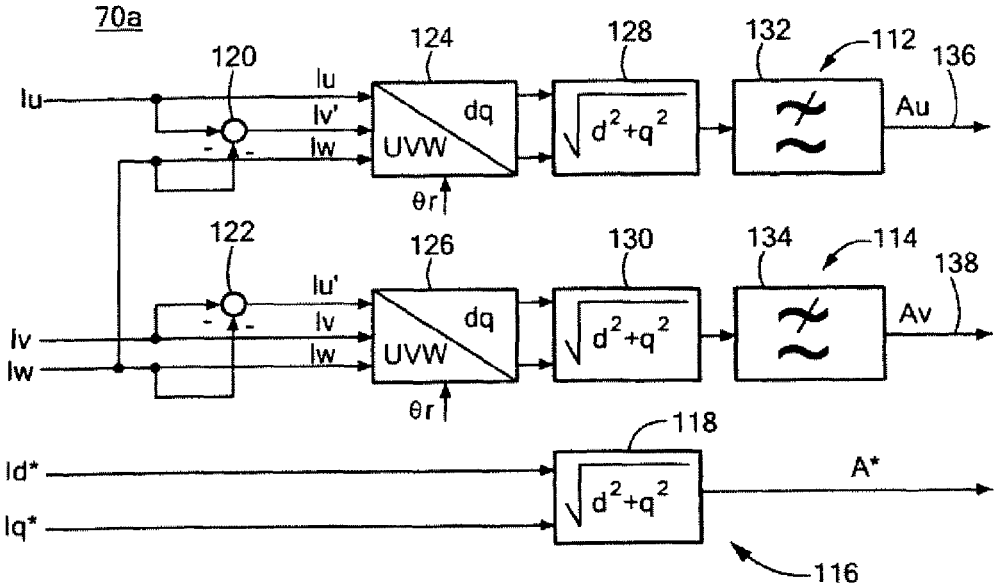
FIG. 9 is a schematic block diagram of one part of the adaptive gain adjustment circuit according to this invention including the amplitude detector and averager circuit.
Figure 10:
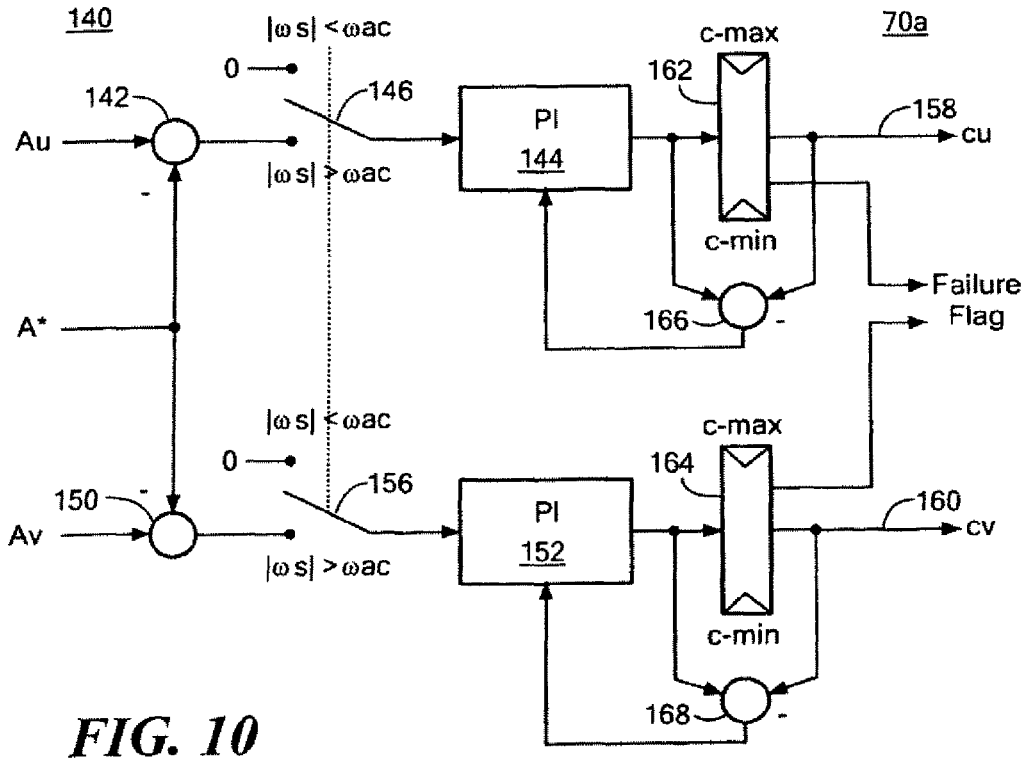
FIG. 10 is a schematic block diagram of another part of the adaptive gain adaptive circuit according to this invention including the closed loop gain adjustment.
Figure 13:
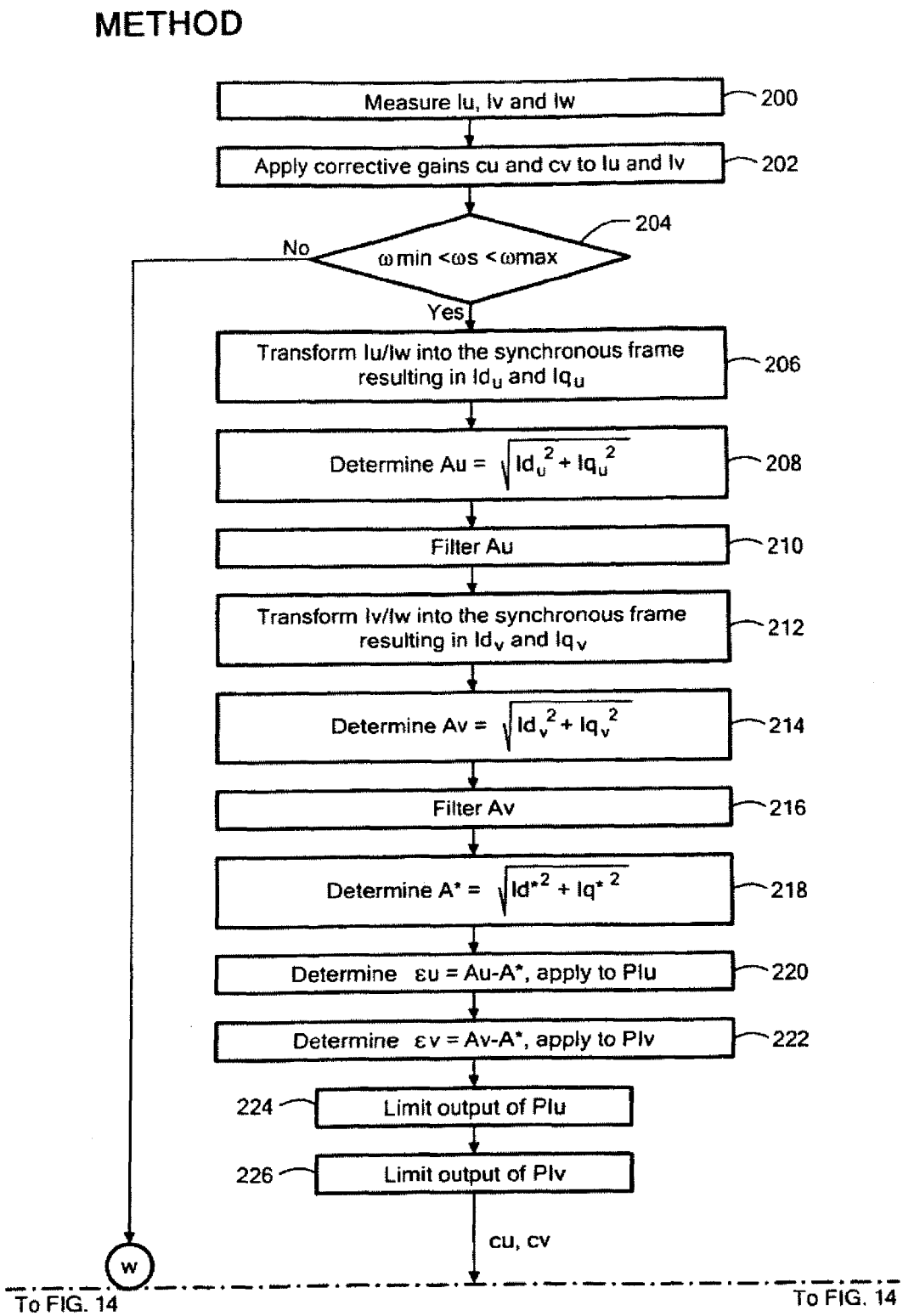
FIG. 13 is a flow chart of the method of this invention.

The invention is not limited to the system as shown in FIGS. 2, 9 and 10, as other apparatus could be used and the invention is not limited to apparatus but also embraces the method as shown and explained with additional detail in FIG. 13. In an actual operational application Iu, Iv and Iw would be measured 200, FIG. 13, then the corrective gains cu, cv, if any, would be applied to Iu and Iv 202. In a real application the system would then seek first to see whether the frequency is within the predetermined range as indicated at 204. If it is, then a calibration mode is entered. Iu/Iw is transformed from the fixed frame to the synchronous frame resulting in $Id_u$ and $Iq_u$ 206. At 208 the amplitude Au is determined from the square root of the squares of $Id_u^2$ and $Iq_u^2$ after which the amplitude is filtered 210. Then Iv/Iw is transformed 212 into the synchronous frame from the fixed frame resulting in $Id_v$ and $Iq_v$. The amplitude Av is determined 214 from the square root of the sum of the squares $Id_v^2+Iq_v^2$. The amplitude is filtered or averaged at 216. A determination is made of the reference amplitude A* 218 from the square root from the sum of the squares of $Id^{*2}$ and $Iq^{*2}$. The error value εu=Au−A* is applied to the proportional-integral controller u in 220 and the error εv is calculated from Av−A* and is applied to the proportional-integral controller v 222. The output of the proportional-integral controllers PIu and PIv are subject to limiting 224, 226 and provide the gain correction values cu and cv.

Figure 14:
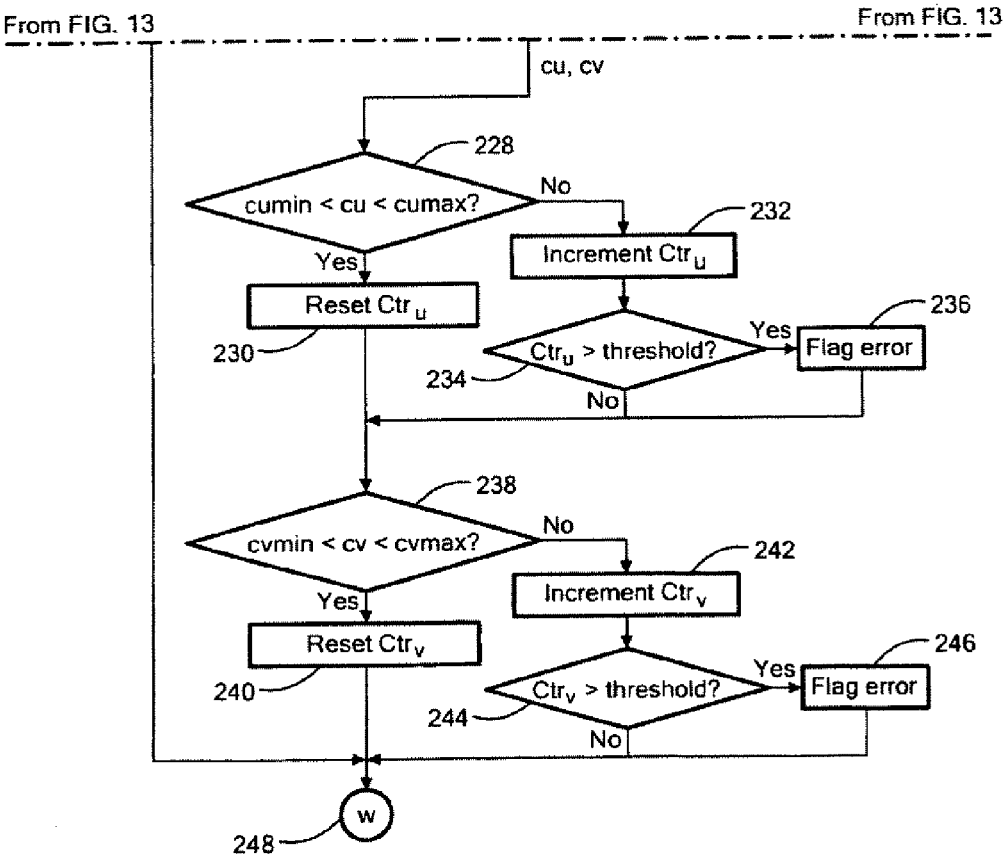
FIG. 14 is a flow chart showing a diagnostic routine according to this invention.

A diagnostic routine can be implemented according to this invention as shown in FIG. 14, which receives at its input gain factors cu and cv. Inquiry is made at 228 first as to whether cu is within a minimum and maximum. If it is the u counter is reset 230. If it is not the counter is incremented 232. If the counter has reached a predetermined threshold 234 an error flag is raised 236. Then inquiry is made as to whether gain correction factor cv is between the maximum and minimum 238. If it is, the v counter is reset 240; if it is not, counter v is Incremented 242 and an inquiry is made as to whether the counter has reached a predetermined threshold 244; if it has, an error flag is set 246.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A multiphase current sensing system having at least three phases [wherein the sum of the phase currents is zero], *the multiphase current sensing system* comprising:

first and second sensors responsive to a.c. and d.c. currents for sensing the current in the first and second phases, respectively;

a third current [transformer] sensor responsive to a.c. current in a predetermined frequency range for sensing the current in the third phase; and an adaptive gain adjustment circuit for combining the [current] *currents* sensed by the first and third sensors and the [current] *currents* sensed by the second and the third sensors *and operable* to determine [a], *based on one or more of the currents sensed by the first, second, and third sensors,* gain correction [factor] *factors* to be applied to the currents sensed by [said] *the* first and second sensors[, respectively].

2. The multiphase current sensing system of claim 1 in which said adaptive gain adjustment circuit includes a memory device for storing the gain correction factors during periods when the [a.c.,] *a.c.* frequency is without said predetermined *frequency* range.

3. The multiphase current sensing system of claim 1 in which said adaptive gain adjustment circuit includes a first amplitude detector responsive to the currents sensed by said first and third sensors to provide a first average amplitude and a second amplitude detector responsive to the currents sensed by said second and third sensors to provide a second average amplitude.

4. The multiphase current sensing system of claim 3 in which said adaptive gain adjustment circuit includes an arithmetic circuit responsive to first and second current set points to provide an amplitude reference.

5. The multiphase current sensing system of claim 3 in which each said amplitude detector includes a transformer circuit for transforming the sensed currents from [the] *a* fixed frame to a synchronous frame coordinate system, an arithmetic circuit responsive to *sensed currents from* said synchronous frame [currents] *coordinate system* to provide an amplitude value, and a filter circuit responsive to said amplitude value to provide said average amplitude.

6. The multiphase current sensing system of claim 4 in which said adaptive gain adjustment circuit includes first and second regulators, responsive to said first and second average amplitudes, respectively, and said amplitude reference for calculating the [said] gain correction factors.

7. The multiphase current sensing system of claim 6 in which each said regulator includes a summing circuit for determining the error value between said amplitude reference and the respective ones of said average amplitudes, a proportional-integral controller, and a switching circuit for selectively applying said error value to said proportional-integral controller within said predetermined *frequency* range.

8. The multiphase current sensing system of claim 7 in which said proportional-integral controller retains its integrated error value even when [said] *a* frequency range is outside said predetermined frequency range.

9. The multiphase current sensing system of claim 7 in which each said regulator includes a limiter circuit for limiting the gain correction [factor] *factors* to a predetermined range.

10. The multiphase current sensing system of claim 7 in which each said regulator includes a diagnostic circuit having a comparator responsive to a reference level and a [said] *corresponding* gain correction factor for determining when said *corresponding* gain correction factor exceeds a predetermined value and a timer for providing a failure alarm when said gain correction factor exceeds said predetermined value for a predetermined time.

11. The multiphase current sensing system of claim 1 in which said adaptive gain adjustment circuit includes a multiplier circuit associated with each of said first and second sensors for applying said gain correction factors.

12. The multiphase current sensing system of claim 4 in which said set points are synchronous frame set points of a field oriented motor control including a power stage for converting [d.c.,] *d.c.* power to multiphase [a.c.,] *a.c.* to drive a motor, a pulse width modulator for operating said power stage and a synchronous frame regulator responsive to said synchronous frame set points and position to provide fixed frame outputs to drive said pulse width modulator.

13. A three phase current sensing system comprising:

a motor control wherein the sum of three phase currents is zero, said motor control including a power stage for converting [d.c.,] *d.c.* power to three phase [a.c.,] *a.c.* to drive a motor;

a pulse width modulator for operating said power stage and a synchronous frame regulator responsive to [said] synchronous frame set points and position to provide fixed frame outputs to drive said pulse width modulator *of* said system;

first and second sensors responsive to [a.c.,] *a.c.* and [d.c.,] *d.c.* currents for sensing the current in the first and second phases, respectively;

a third current transformer sensor responsive to [a.c.,] *a.c.* current in a predetermined frequency range for sensing the current in the third phase; and an adaptive gain adjustment current for combining the current sensed by the first and third sensors and the current sensed by the second and the third sensors to determine [a] gain correction [factor] *factors* to be applied to the currents sensed by said first and second sensors, respectively.

14. The three phase current sensing system of claim 13 in which said adaptive gain adjustment circuit includes a memory device for storing the gain correction factors during periods when the [a.c.] *a.c.* frequency is without said predetermined *frequency* range.

15. The three phase current sensing system of claim 13 in which said adaptive gain adjustment circuit includes a first amplitude detector responsive to the currents sensed by said first and third sensors to provide a first average amplitude and a second amplitude detector responsive to the currents sensed by said second and third amplitude sensors to provide a second average amplitude.

16. The three phase current sensing system of claim 15 in which said adaptive gain adjustment circuit includes an arithmetic circuit responsive to first and second set points to provide an amplitude reference.

17. The three phase current sensing system of claim 15 in which each said amplitude detector includes a transformer circuit for transforming the sensed currents from [the] *a* fixed frame to a synchronous frame coordinate system, an arithmetic circuit responsive to *sensed currents from* said synchronous frame [currents] *coordinate system* to provide an amplitude value, and a filter circuit responsive to said amplitude value to provide said average amplitude.

18. The three phase current sensing system of claim 16 in which said adaptive gain adjustment circuit includes first and second regulators, responsive to said first and second average amplitudes, respectively, and said amplitude reference for calculating the [said] gain correction factors.

19. The three phase current sensing system of claim 18 in which each said regulator includes a summing circuit for determining the error value between said amplitude reference and the respective ones of said average amplitudes, a proportional-integral controller, and a switching circuit for selectively applying said error value to said proportional-integral controller within said predetermined *frequency* range.

20. A multiphase current sensing method wherein the sum of the phase currents is zero comprising:

sensing [a.c,] *a.c.* and/or [d.c,] *d.c.* currents in first and second phases;

sensing [a.c,] *a.c.* current in a predetermined [a.c,] *a.c.* frequency range in a third phase; and combining the [current] *currents* sensed in said first and third phases and the second and third phases and determining [a] gain correction [factor] *factors* to be applied to the currents sensed in said first and second phases.

21. The multiphase current sensing method of claim 20 further including storing the gain correction factors during periods when the [a.c,] *a.c.* frequency is without said predetermined *frequency* range.

22. The multiphase current sensing method of claim 20 in which said combining the [current] *currents* includes determining first and second average amplitudes and an amplitude reference.

23. The multiphase current sensing method of claim 22 in which said combining *the* currents further includes transforming the [second] currents from a [first] *fixed* frame to a synchronous frame coordinate system, converting the *currents from the* synchronous frame [currents] *coordinate system* to an amplitude value and filtering the amplitude value to provide the first and second average amplitudes and from the first and second average amplitudes calculating the gain correction factors for the first and second phases.

24. A multiphase current sensing method for a three phase motor control where the sum of the phase currents is zero comprising:

measuring [a.c,] *a.c.* and/or [d.c,] *d.c.* currents in first and second phases;

measuring the current in a predetermined [a.c,] *a.c.* frequency range in a third phase;

transforming the first and third phase currents from a fixed frame to a synchronous frame and determining the first phase average current amplitude;

[transform] *transforming* the second and third phase currents from [a] *the* fixed frame to [a] *the* synchronous frame and determining the second phase average current amplitude;

calculating a current amplitude reference from [the] setpoints of the motor control;

combining the first phase average current amplitude and the current amplitude reference to produce a first phase current gain correction factor and the second phase average current amplitude and the current amplitude reference to produce a second phase current gain correction factor; and applying said first and second gain correction factors to *said* first and second phase currents, *respectively*.

25. The method of claim 24 further including determining whether either gain correction factor is without a predetermined gain correction factor range; monitoring the period during which the gain correction factor is without said predetermined gain correction factor range and setting a failure flag if that period exceeds a predetermined time.

*26. The multiphase current sensing system of claim 1, wherein the gain correction factors are determined based on the currents sensed by the first and third sensors and the currents sensed by the second and third sensors.*

* * * * *